(12) United States Patent
Kim et al.

(10) Patent No.: US 12,392,835 B2
(45) Date of Patent: Aug. 19, 2025

(54) METHOD OF ESTIMATING STATE OF CHARGE OF BATTERY

(71) Applicants: Samsung SDI Co., Ltd., Yongin-si (KR); POSTECH Research and Business Development Foundation, Pohang-si (KR)

(72) Inventors: Jake Kim, Yongin-si (KR); Giheon Kim, Yongin-si (KR); Sangwoo Kim, Pohang-si (KR); Youngbin Song, Pohang-si (KR); Minhwan Seo, Pohang-si (KR)

(73) Assignees: Samsung SDI Co., Ltd., Yongin-si (KR); POSTECH Research and Business Development Foundation, Pohang-si (KR)

( * ) Notice: Subject to any disclaimer, the term of this patent is extended or adjusted under 35 U.S.C. 154(b) by 104 days.

(21) Appl. No.: 18/202,184

(22) Filed: May 25, 2023

(65) Prior Publication Data

US 2023/0384387 A1    Nov. 30, 2023

(30) Foreign Application Priority Data

May 25, 2022   (KR) ........................ 10-2022-0064256

(51) Int. Cl.
*G01R 31/3842*   (2019.01)
*G01R 31/367*    (2019.01)

(52) U.S. Cl.
CPC ....... *G01R 31/3842* (2019.01); *G01R 31/367* (2019.01)

(58) Field of Classification Search
None
See application file for complete search history.

(56) References Cited

U.S. PATENT DOCUMENTS 10,175,302 B2    1/2019  Zhong et al.
2015/0377974 A1* 12/2015  Choi .................... G01R 31/367
                                                            702/63
(Continued)

FOREIGN PATENT DOCUMENTS

CN       111323705 A     6/2020
KR   10-2019-0100065 A   8/2019
(Continued)

OTHER PUBLICATIONS

Shi, Na et al., "State-of-charge estimation for the lithium-ion battery based on adaptive extended Kalman filter using improved parameter identification," Journal of Energy Storage, vol. 45, 2022, 13 pages.

(Continued)

*Primary Examiner* — Jas A Sanghera
(74) *Attorney, Agent, or Firm* — Womble Bond Dickinson (US) LLP

(57) ABSTRACT

A method of estimating a state of charge of a battery, includes: generating a present voltage value $V_t(k)$ and a present current value $I_L(k)$ by detecting a voltage and a current of the battery; determining a reference open-circuit voltage value $V_{OC,ref}(k)$ based on a state-of-charge estimation value $SOC(k)$; estimating first to third parameter values $\alpha_1(k)$, $\alpha_2(k)$, and $\alpha_3(k)$ from the present voltage value $V_t(k)$, the reference open-circuit voltage value $V_{OC,ref}(k)$, the present current value $I_L(k)$, and a previous current value $I_L(k-1)$ by using recursive least squares (RLS); and determining, using an extended Kalman filter (EKF), a next state-of-charge estimation value $SOC(k+1)$ of the battery from the state-of-charge estimation value $SOC(k)$, the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$.

10 Claims, 10 Drawing Sheets

(56) References Cited

U.S. PATENT DOCUMENTS

| 2021/0048480 A1 | 2/2021 | Lim et al. |
| 2021/0199724 A1 | 7/2021 | Kim |
| 2021/0215767 A1 | 7/2021 | Lim |
| 2023/0358810 A1 | 11/2023 | Rayappan et al. |

FOREIGN PATENT DOCUMENTS

| KR | 10-2019-0123172 A | 10/2019 |
| KR | 10-2020-0102927 A | 9/2020 |
| KR | 10-2022-0034543 A | 3/2022 |

OTHER PUBLICATIONS

Yang, Lin et al., "Supervisory long-term prediction of state of available power for lithium-ion batteries in electric vehicles," Applied Energy, vol. 257, 2020, 18 pages.

EPO Extended European Search Report dated Oct. 19, 2023, issued in European Patent Application No. 23175435.9 (11 pages).

El Mejdoubi, Asmae, et al., "State-Of-Charge and State-Of-Health Lithium-Ion Batteries' Diagnosis According to Surface Temperature Variation," IEEE Transactions on Industrial Electronics, Apr. 2016, vol. 63, No. 4, pp. 2391-2402.

Lin, Xinfan, et al., "Online Parameterization of Lumped Thermal Dynamics in Cylindrical Lithium Ion Batteries for Core Temperature Estimation and Health Monitoring," IEEE Transactions on Control Systems Technology, Sep. 2013, vol. 21, No. 5, pp. 1745-1755.

Liu, Xintian, et al., "A Dynamic State-Of-Charge Estimation Method for Electric Vehicle Lithium-Ion Batteries," Energies, 2020, vol. 13, No. 121, 16 pages.

Xing, Yinjiao, et al., "State of charge estimation of lithium-ion batteries using the open-circuit voltage at various ambient temperatures," Applied Energy, 2014, vol. 113, pp. 106-115.

Zhi, Li et al., "State of charge estimation for Li-ion battery based on extended Kalman filter," The 8th International Conference on Applied Energy—ICAE2016, Energy Procedia, 2017, vol. 105, pp. 3515-3520.

Korean Office Action for KR Application No. 10-2022-0064256, dated Feb. 14, 2025, 7 pages.

* cited by examiner

METHOD OF ESTIMATING STATE OF CHARGE OF BATTERY

CROSS-REFERENCE TO RELATED APPLICATION

This application claims priority to and the benefit of Korean Patent Application No. 10-2022-0064256, filed on May 25, 2022, in the Korean Intellectual Property Office, the entire disclosure of which is incorporated by reference herein.

BACKGROUND

1. Field

Aspects of one or more embodiments of the present disclosure relate to a method of estimating a state of charge of a battery, and more particularly, to a method of estimating a state of charge of a battery by using a battery parametric model that is robust to changes in the ambient temperature.

2. Description of the Related Art

As a next-generation energy storage device, lithium ion batteries may be desirable as having high energy density, high power density, and/or a long lifetime. Accordingly, the ability to safely and efficiently use the lithium-ion batteries may be desired. As such, it may be desirable to be able to accurately estimate a state of charge (SOC) of the battery.

The above information disclosed in this Background section is for enhancement of understanding of the background of the present disclosure, and therefore, it may contain information that does not constitute prior art.

SUMMARY

Initially, SOC estimation techniques that are applied to batteries at room temperature were developed, but as the ambient temperature may have a great influence on the characteristics of a battery, SOC estimation techniques considering changes in ambient temperature have recently been studied. This is because applications with batteries may be exposed not only to room temperature, but also to various ambient temperatures depending on the season and region in which they are operated.

One recent SOC estimation technique converts parameter changes of a battery internal resistance (Rint) model into a look-up table through a preliminary temperature experiment in an ambient temperature range of 0° C. to 50° C. Such an SOC estimation technique may compensate for a voltage modeling error generated from a simple internal resistance (Rint) model, with a constant term by using a temperature function generated through a preliminary temperature experiment, thereby improving the accuracy of voltage modeling and SOC estimation. However, in this case, preliminary battery characteristic tests at many different temperature points may be required to consider a wide range of ambient temperatures.

Another SOC estimation technique estimates an SOC without compensating for a modeling error with a constant term in an ambient temperature range of −10° C. to 40° C., by using a battery Thevenin model that is slightly more complicated than the internal resistance (Rint) model. However, it may be difficult or impossible to accurately estimate an SOC, unless a preliminary temperature experiment is performed to identify changes in parameter characteristics of the battery model at all temperature points within the ambient temperature range.

Another SOC estimation technique estimates the internal resistance and capacitance of a battery in real time, which have been analyzed through a preliminary temperature experiment in the previous SOC estimation technique, reflect the internal resistance and capacitance in a battery model, and then estimate the SOC of the battery in an ambient temperature range of 10° C. to 40° C. However, in this case, there may be a limitation in that an open-circuit voltage (OCV) characteristic curve of the battery, which is greatly affected by the ambient temperature, may need to be identified and applied through a preliminary temperature experiment.

One or more embodiments of the present disclosure are directed to a battery parametric model for accurately estimating the state of charge (SOC) of a battery, even when a battery operating temperature environment changes according to the season and region in which it is used. According to a comparative example, the accuracy of the battery SOC estimation may be improved after identifying changes in battery characteristics in a wide temperature range through a preliminary temperature experiment. However, according to one or more embodiments of the present disclosure, it may be sufficient to perform a battery characteristic test at one representative temperature (e.g., room temperature). According to one or more embodiments, robustness to temperature changes may be obtained by compensating for and reflecting changes in battery characteristics with respect to temperature, in parameters of a battery parametric model. One or more embodiments include a method and device for estimating an SOC, and capable of reducing errors in voltage modeling and SOC estimation.

One or more embodiments or the present disclosure are directed to a method and device for accurately estimating an SOC of a battery by using recursive least squares (RLS) and an extended Kalman filter (EKF).

Additional aspects and features of the present disclosure will be set forth, in part, in the description that follows, and in part, will be apparent from the description, or may be learned by practicing one or more of the presented embodiments of the present disclosure.

According to one or more embodiments of the present disclosure, a method of estimating a state of charge of a battery, includes: generating a present voltage value $V_t(k)$ and a present current value $I_L(k)$ by detecting a voltage and a current of the battery; determining a reference open-circuit voltage value $V_{OC,ref}(k)$ based on a state-of-charge estimation value $SOC(k)$; estimating first to third parameter values $\alpha_1(k)$, $\alpha_2(k)$, and $\alpha_3(k)$ from the present voltage value $V_t(k)$, the reference open-circuit voltage value $V_{OC,ref}(k)$, the present current value $I_L(k)$, and a previous current value $I_L(k-1)$ by using recursive least squares (RLS); and determining, using an extended Kalman filter (EKF), a next state-of-charge estimation value $SOC(k+1)$ of the battery from the state-of-charge estimation value $SOC(k)$, the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$.

In an embodiment, the first to third parameter values $\alpha_1(k)$, $\alpha_2(k)$, and $\alpha_3(k)$ may be estimated to minimize a square of an error $e(k)$ between the present voltage value $V_t(k)$ and the present voltage estimation value $V\hat{}_t(k)$.

In an embodiment, a parameter matrix $\theta(k)$ including the first to third parameter values $\alpha_1(k)$, $\alpha_2(k)$, and $\alpha_3(k)$ may be determined by $\theta(k)=\theta(k-1)+K(k)e(k)$, where $K(k)$ may be a gain matrix, and the error $e(k)$ may be determined according to $e(k)=V_t(k)-V\hat{}_t(k)$.

In an embodiment, the present voltage estimation value $V\hat{}_t(k)$ may be determined by using a regressor matrix $\phi(k)$ including the reference open-circuit voltage value $V_{OC,ref}(k)$, the present current value $I_L(k)$, the previous current value $I_L(k-1)$, and a previous value $\theta(k-1)$ of the parameter matrix, according to $V\hat{}_t(k)=\theta^T(k-1)\phi(k)$, where the regressor matrix $\phi(k)$ may be defined according to $\phi(k)=[V_{OC,ref}(k), I_L(k), I_L(k-1)]^T$, and the parameter matrix $\theta(k)$ may be defined according to $\theta(k)=[\alpha_1(k), \alpha_2(k), \alpha_3(k)]^T$.

In an embodiment, the gain matrix $K(k)$ may be determined by $K(k)=P(k)\phi(k)=P(k-1)\phi(k)/[\lambda(k)+\phi^T(k)P(k-1)\phi(k)]$, where $P(k)$ may be a covariance matrix, and $\lambda(k)$ may be a forgetting factor.

In an embodiment, the covariance matrix $P(k)$ may be determined by $P(k)=(P(k-1)-K(k)\phi^T(k)P(k-1))/\lambda(k)$.

In an embodiment, a value of the forgetting factor $\lambda(k)$ may decrease when a difference between the present voltage value $V_t(k)$ and the previous voltage value $V_t(k-1)$ is greater than a preset value.

In an embodiment, the EKF may include a state equation defined according to $SOC(k+1)=SOC(k)+(\eta T/C_n)*I_L(k)+w(k)$, and a battery model equation defined according to $V_t(k)=\alpha_1(k)h(SOC(k))+\alpha_2(k)I_L(k)+\alpha_3(k)I_L(k-1)+v(k)$, where $\eta$ may be a charge and discharge efficiency, T may be a sampling period, $C_n$ may be a capacity of the battery, $w(k)$ may be process noise, $v(k)$ may be observation noise, and $h(SOC(k))$ may be the reference open-circuit voltage value $V_{OC,ref}(k)$.

In an embodiment, a computer program stored in a medium and executable by a computing device may perform the method.

According to one or more embodiments of the present disclosure, a device for estimating a state of charge of a battery, includes: memory configured to store an SOC-$V_{OC,ref}$ relationship between a state-of-charge value and an open-circuit voltage value of the battery at a reference temperature; a receiver configured to receive a present voltage value $V_t(k)$ and a present current value $I_L(k)$, which are generated by detecting a voltage and a current of the battery; a reference open-circuit voltage determination circuit configured to determine a reference open-circuit voltage value $V_{OC,ref}(k)$ corresponding to a state-of-charge estimation value $SOC(k)$ by using the SOC-$V_{OC,ref}$ relationship stored in the memory; a parameter estimation circuit configured to estimate first to third parameter values $\alpha_1(k)$, $\alpha_2(k)$, and $\alpha_3(k)$ by using recursive least squares (RLS), from the present voltage value $V_t(k)$, the reference open-circuit voltage value $V_{OC,ref}(k)$, the present current value $I_L(k)$, and a previous current value $I_L(k-1)$; and a state-of-charge estimation circuit configured to determine a next state-of-charge estimation value $SOC(k+1)$ of the battery by using an extended Kalman filter (EKF), from the state-of-charge estimation value $SOC(k)$, the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$.

BRIEF DESCRIPTION OF THE DRAWINGS

The above and other aspects and features of the present disclosure will be more clearly understood from the following detailed description of the illustrative, non-limiting embodiments with reference to the accompanying drawings, in which.

DETAILED DESCRIPTION

Figure 1:
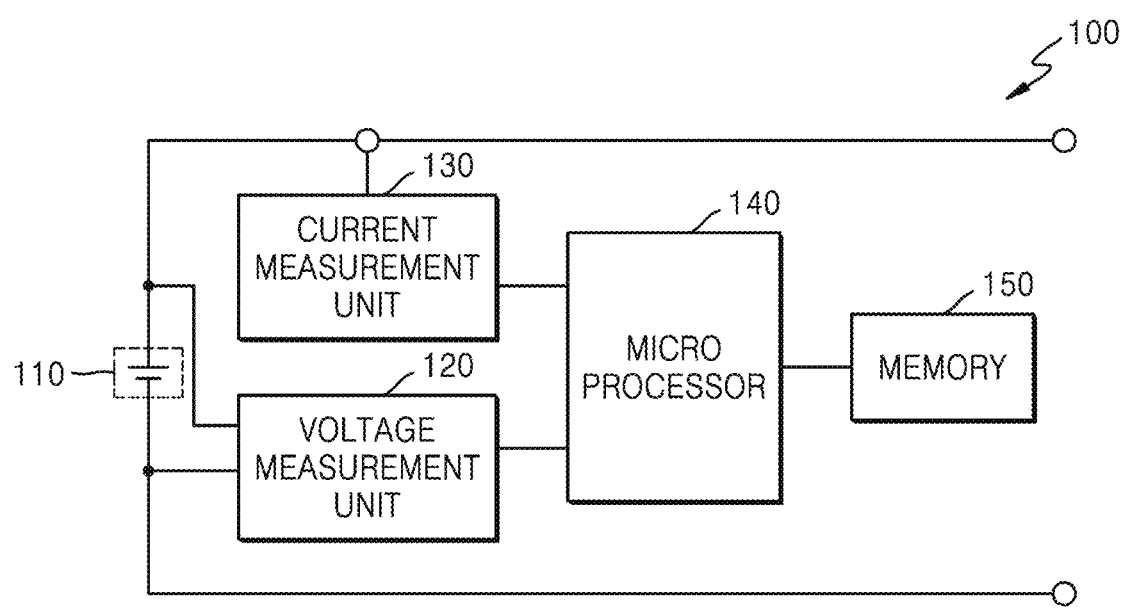
FIG. 1 is a schematic configuration block diagram of a battery system for performing a method of estimating a state of charge of a battery, according to an embodiment.

Hereinafter, embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, redundant description thereof may not be repeated.

When a certain embodiment may be implemented differently, a specific process order may be different from the described order. For example, two consecutively described processes may be performed at the same or substantially at the same time, or may be performed in an order opposite to the described order.

In the drawings, the relative sizes, thicknesses, and ratios of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when a layer, an area, or an element is referred to as being "electrically connected" to another layer, area, or element, it may be directly electrically connected to the other layer, area, or element, and/or may be indirectly electrically connected with one or more intervening layers, areas, or elements therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. For example, the expression "A and/or B" denotes A, B, or A and B. Expressions such as "at least one of," when preceding a list of elements, modify the entire list of elements and do not modify the individual elements of the list. For example, the expression "at least one of a, b, or c," "at least one of a, b, and c," and "at least one selected from the group consisting of a, b, and c" indicates only a, only b, only c, both a and b, both a and c, both b and c, all of a, b, and c, or variations thereof.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively.

The electronic or electric devices and/or any other relevant devices or components according to embodiments of the present disclosure (e.g., the various units, circuits, and/or the like) described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the example embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a schematic configuration block diagram of a battery system for performing a method of estimating a state of charge (SOC) of a battery, according to an embodiment.

Referring to FIG. 1, a battery system 100 may include a battery 110, a voltage measurement unit (e.g., a voltage measurement circuit) 120, a current measurement unit (e.g., a current measurement circuit) 130, a microprocessor 140, and a memory 150.

The battery 110 is a component that stores power, and includes at least one battery cell. The battery 110 may include a plurality of battery cells. The battery cells may be connected to each other in series, in parallel, or in a combination of series and parallel connections.

The battery cell may include a rechargeable secondary battery. For example, the battery cells may include a nickel-cadmium battery, a lead-acid battery, a nickel-metal hydride (NiMH) battery, a lithium-ion battery, a lithium polymer battery, and/or the like. The number of battery cells included in the battery 110 may be determined according to a desired output voltage.

Although FIG. 1 illustrates one battery 110 for convenience of illustration, the present disclosure is not limited thereto, and a plurality of batteries 110 may be connected to each other in parallel and/or in series, and may be connected to a load and/or a charging device through external terminals. The battery 110 may be electrically connected to an electric load and/or a charging device while operating, and may be discharged to supply power to the electric load, or may be charged by receiving power from the charging device. For example, the battery 110 may be mounted on an electric vehicle to supply electric power stored in the battery 110 to a motor of the electric vehicle for driving the electric vehicle, and electric power generated during regenerative braking of the electric vehicle may be supplied to the battery 110 to charge the battery 110. As used in the present specification, the expression "the battery 110 is operating" refers to discharging current to the motor for driving the electric vehicle, or charging the battery 110 with current generated by regenerative braking, as described above.

The voltage measurement unit 120 may be connected to both terminals of the operating battery 110, and may periodically measure the voltage of the battery 110 to generate a voltage value. For example, the voltage measurement unit 120 may measure the voltage of both terminals of the battery 110 at a sampling time period $\Delta t$, and a recently measured voltage value may be referred to as a present voltage value expressed as $V_t(k)$. In addition, a voltage value measured before the sampling time period $\Delta t$ may be referred to as a previous voltage value expressed as $V_t(k-1)$. The sampling time period $\Delta t$ may be, for example, 1 second. However, the present disclosure is not limited thereto, and the sampling time period $\Delta t$ may be (e.g., may be set to) other suitable time periods. For example, the sampling time period $\Delta t$ may be (e.g., may be set to) 0.1 seconds, 0.5 seconds, 2 seconds, 5 seconds, or 10 seconds. The sampling time period $\Delta t$ may correspond to (e.g., may be appropriately set according to) an electrical system in which the battery 110 is used.

The k and k−1 described above denote the sampling times of the measured values, such that $V_t(k)$ denotes the currently measured value, $V_t(k-1)$ denotes the previously measured value, and $V_t(k+1)$ denotes the next measured value.

Although FIG. 1 illustrates that the voltage measurement unit 120 measures the voltage of both terminals of the battery 110, the present disclosure is not limited thereto, and the voltage measurement unit 120 may also be connected between external terminals of the battery system 100 to periodically measure the terminal voltage of the battery 110. According to another embodiment, in a case in which the battery 110 is composed of a plurality of battery cells, a plurality of battery modules, or a plurality of battery packs, the voltage measurement unit 120 may measure the voltage of both terminals of each battery cell, each battery module, or each battery pack.

The current measurement unit 130 may periodically measure the current of the operating battery 110 to generate a current value. The voltage measurement unit 120 and the current measurement unit 130 may be synchronized or substantially synchronized with each other to measure the voltage and the current of the battery 110 at the same or substantially the same time point as each other. The current measurement unit 130 may measure the current of the battery 110 at the sampling time period $\Delta t$. The current value measured by the current measurement unit 130 may be expressed as a positive (+) value when the current is a charging current, and as a negative (−) value when the current is a discharging current. A recently measured current value may be referred to as a present current value expressed as $I_L(k)$, and a current value measured before the sampling time period $\Delta t$ may be referred to as a previous current value expressed as $I_L(k-1)$.

For example, the current measurement unit 130 may measure a current according to a current waveform for electric vehicle verification, which is periodically input to the battery 110, and concurrently or substantially simultaneously (e.g., at the same or substantially at the same time), the voltage measurement unit 120 may measure a terminal voltage output from the battery 110.

The microprocessor 140 may estimate an SOC of the battery 110 based on a voltage value provided by the voltage measurement unit 120 and a current value provided by the current measurement unit 130. The microprocessor 140 may determine a reference open-circuit voltage value $V_{OC,ref}(k)$. The microprocessor 140 may estimate first to third parameter values $\alpha_1(k)$, $\alpha_2(k)$, and $\alpha_3(k)$ based on a present voltage value $V_t(k)$, the reference open-circuit voltage value $V_{OC,ref}(k)$, a present current value $I_L(k)$, and a previous current value $I_L(k-1)$. The microprocessor 140 may generate a next SOC estimation value SOC(k+1) of the battery 110 by using the first to third parameter values $\alpha_1(k)$, $\alpha_2(k)$, and $\alpha_3(k)$. After the sampling time period $\Delta t$, the next SOC estimation value SOC(k+1) becomes a present SOC estimation value SOC(k), and the microprocessor 140 may be configured to determine the reference open-circuit voltage value $V_{OC,ref}(k)$ based on the present SOC estimation value SOC(k).

Although it is described herein that the next SOC estimation value SOC(k+1) of the battery 110 is generated by using the first to third parameter values $\alpha_1(k)$, $\alpha_2(k)$, and $\alpha_3(k)$, it may also be understood that, when the present SOC estimation value SOC(k) is generated and the present SOC estimation value SOC(k) becomes a previous SOC estimation value SOC(k−1) after the sampling time period $\Delta t$, the reference open-circuit voltage value $V_{OC,ref}(k)$ is determined based on the previous SOC estimation value SOC(k−1).

The microprocessor 140 may determine the reference open-circuit voltage value $V_{OC,ref}(k)$ corresponding to the present SOC estimation value SOC(k), by using an SOC-$V_{OC,ref}$ relationship between an SOC value and an open-circuit voltage value of the battery 110 obtained by a preliminary experiment at a reference temperature. The reference temperature may be, for example, 20° C. The SOC-$V_{OC,ref}$ relationship may be stored in the memory 150 in the form of a lookup table. The present SOC estimation value SOC(k) is the next SOC estimation value SOC(k+1) generated by the microprocessor 140 before the sampling time period $\Delta t$. The present SOC estimation value SOC(k) may be referred to as an SOC estimation value SOC(k).

The microprocessor 140 may use an adaptive filter to estimate the first to third parameter values $\alpha_1(k)$, $\alpha_2(k)$, and $\alpha_3(k)$, based on the present voltage value $V_t(k)$, the reference open-circuit voltage value $V_{OC,ref}(k)$, the present current value $I_L(k)$, and the previous current value $I_L(k-1)$. The adaptive filter used by the microprocessor 140 may be a filter that uses recursive least squares (RLS), or a filter that uses weighted least squares (WLS). Hereinafter, for convenience, an embodiment in which the microprocessor 140 uses RLS will be described in more detail.

The microprocessor 140 may generate the next SOC estimation value SOC(k+1) of the battery 110 by using the first to third parameter values $\alpha_1(k)$, $\alpha_2(k)$, and $\alpha_3(k)$ generated in real time or substantially in real time. The microprocessor 140 may use an extended Kalman filter (EKF) to generate the next SOC estimation value SOC(k+1).

According to the present embodiment, because the microprocessor 140 may perform, with the four fundamental arithmetic operations described above, a method of estimating an SOC of a battery, the microprocessor 140 may be included in a battery management system (BMS) of a battery pack. According to another embodiment, the microprocessor 140 may be included in a BMS or an engine control unit (ECU) of an electric vehicle. According to another embodiment, the microprocessor 140 may be included in a controller of an energy storage system. According to another embodiment, the microprocessor 140 may be implemented as a processor of a server that is communicatively connected to a battery system or an energy storage system.

The memory 150 may store instructions and data used by the microprocessor 140 to perform the method of estimating an SOC of a battery according to the present embodiment. The memory 150 may store an SOC-$V_{OC,ref}$ relationship between an SOC value and an open-circuit voltage value of the battery 110 obtained by a preliminary experiment at a reference temperature, in the form of a lookup table.

According to the present embodiment, only the present voltage value $V_t(k)$, the present current value $I_L(k)$, the reference open-circuit voltage value $V_{OC,ref}(k)$, the previous current value $I_L(k-1)$, the SOC estimation value SOC(k), the first to third parameter values $\alpha_1(k)$, $\alpha_2(k)$, and $\alpha_3(k)$, and the like are stored in the memory 150, and long-term voltage data or current data may not (e.g., may not be needed to) be stored in the memory 150. Because the memory 150 may not need to store a large amount of instructions and data, the memory 150 may be implemented as a small-sized memory. For example, the memory 150 may be implemented as the memory within the microprocessor 140.

Figure 2:
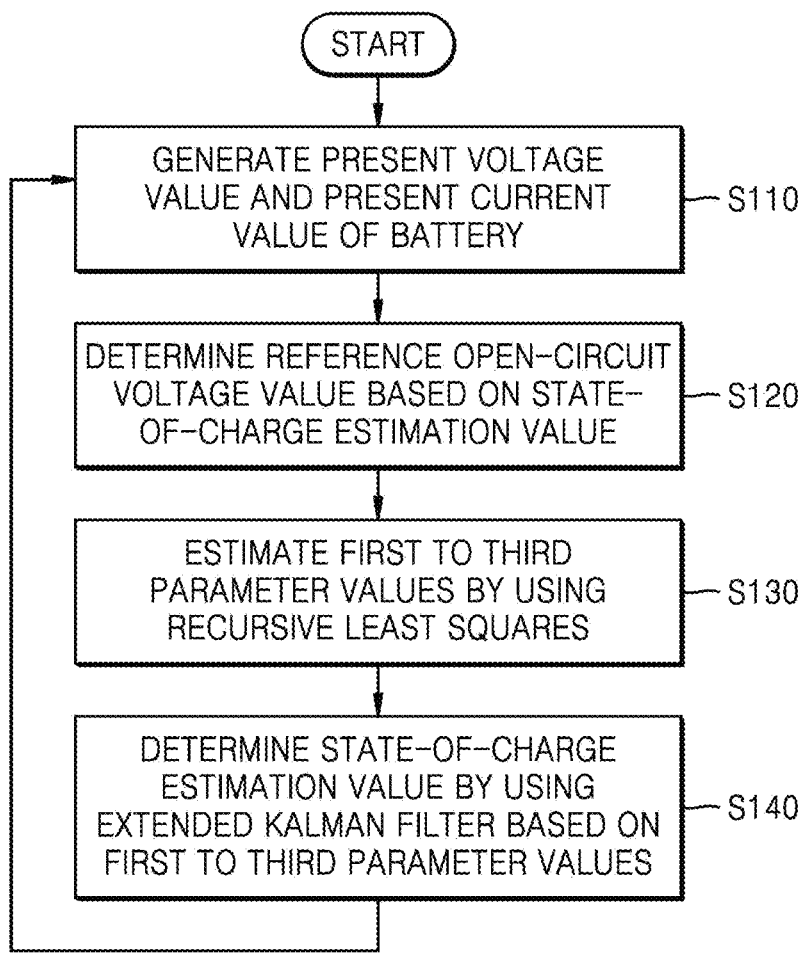
FIG. 2 is a flowchart of a method of estimating a state of charge of a battery according to an embodiment.
Figure 3:
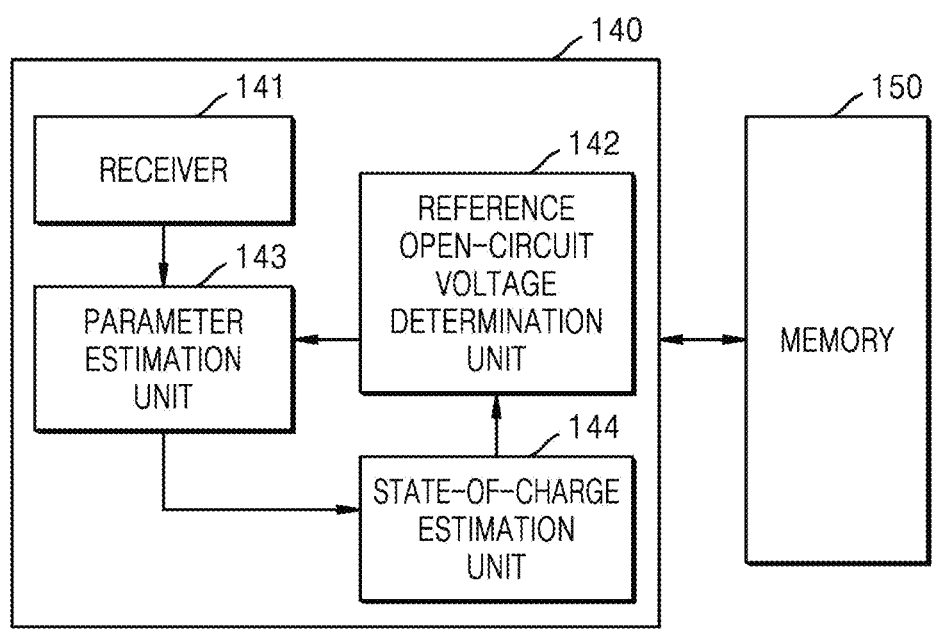
FIG. 3 is an internal configuration block diagram of a microprocessor according to an embodiment.

FIG. 2 is a flowchart of a method of estimating an SOC of a battery according to an embodiment. FIG. 3 is an internal configuration block diagram of a microprocessor according to an embodiment.

Referring to FIGS. 1 to 3, the microprocessor 140 includes a receiver 141, a reference open-circuit voltage determination unit (e.g., a reference open-circuit voltage determination circuit) 142, a parameter estimation unit (e.g., a parameter estimation circuit) 143, and an SOC estimation unit (e.g., an SOC estimation circuit) 144. The microprocessor 140 may be connected to the memory 150, and may refer to an SOC-$V_{OC,ref}$ relationship between an SOC value and an open-circuit voltage value of the battery 110 stored in the memory 150 in the form of a lookup table. The microprocessor 140 may temporarily store, in the memory 150, data used for executing the method of estimating an SOC of a battery.

The microprocessor 140 and the memory 150 may configure a device for estimating an SOC of a battery. The device for estimating an SOC of a battery may be a battery pack or a battery system including a plurality of battery packs. The device for estimating an SOC of a battery may be an electric vehicle, an electric device, or an energy storage system equipped with a battery pack or a battery system.

The method of estimating an SOC of a battery according to one or more embodiments of the present disclosure uses a battery parametric model, which uses (e.g., uses only) an SOC-$V_{OC,ref}$ relationship obtained based on a representative room temperature without a preliminary temperature experiment, to analyze changes in battery characteristics at various ambient temperatures, and thus, may be robust to changes in the ambient temperature. The battery parametric model includes the first to third parameter values $\alpha_1(k)$, $\alpha_2(k)$, and $\alpha_3(k)$ as the model parameters.

The method of estimating an SOC of a battery according to one or more embodiments of the present disclosure may estimate the model parameters, such as the first to third parameter values $\alpha_1(k)$, $\alpha_2(k)$, and $\alpha_3(k)$, in real time or near real time in various temperature environments based on the battery parametric model, and may estimate an SOC of the battery 110 based on the model parameters.

In the method of estimating an SOC of a battery according to an embodiment, the method may start, and the present voltage value $V_t(k)$ and the present current value $I_L(k)$ of the battery 110 may be generated (e.g., at block S110), by detecting the voltage and the current of the battery 110.

The receiver 141 may receive, from the voltage measurement unit 120, the present voltage value $V_t(k)$ generated by detecting the voltage of the battery 110, and the receiver 141 may receive, from the current measurement unit 130, the present current value $I_L(k)$ generated by detecting the current of the battery 110. The receiver 141 may directly receive the voltage of the battery 110, and may generate the present voltage value $V_t(k)$.

The reference open-circuit voltage value $V_{OC,ref}(k)$ may be determined based on the SOC estimation value SOC(k) (e.g., at block S120).

The memory 150 may store an SOC-$V_{OC,ref}$ relationship between an SOC value and an open-circuit voltage value of the battery 110 obtained by a preliminary experiment at a reference temperature, in the form of a lookup table. The memory 150 may not need to store a plurality of SOC-$V_{OC}$ relationships obtained at various ambient temperatures. For example, only one SOC-$V_{OC,ref}$ relationship obtained by a preliminary experiment at a reference temperature may be stored in the memory 150.

The relationship between an SOC and an open-circuit voltage $V_{oc}$ of the battery 110 and the SOC-$V_{OC}$ relationship may vary greatly depending on various different ambient temperatures. In a method according to a comparative example, SOC-$V_{OC}$ relationships are obtained at all ambient temperatures and used for an SOC algorithm, but according to one or more embodiments of the present disclosure, only the SOC-$V_{OC,ref}$ relationship obtained at one representative reference temperature may be used to estimate the voltage and SOC of a battery.

Figure 4:
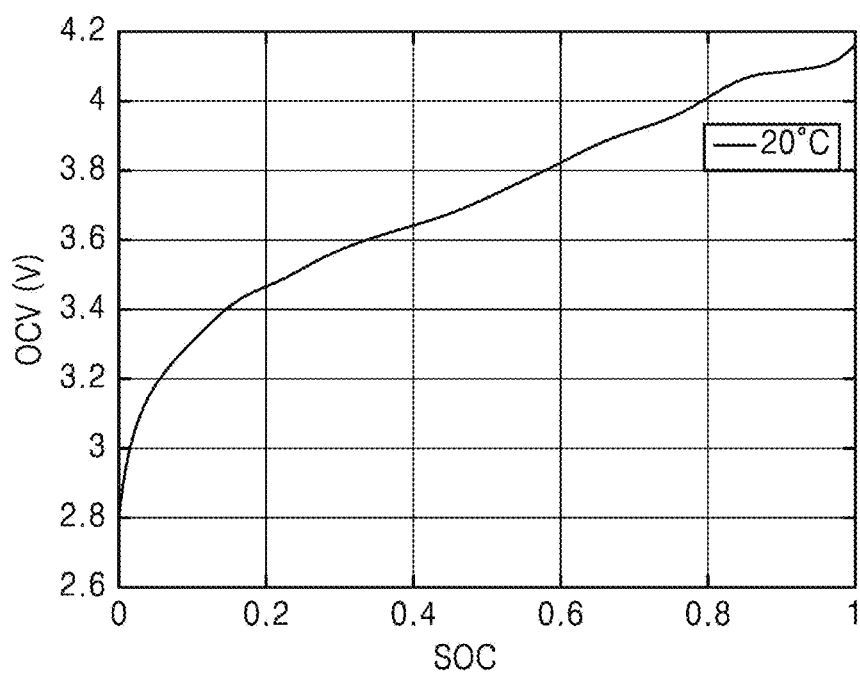
FIG. 4 illustrates a curve representing an SOC-$V_{OC,ref}$ relationship obtained by a preliminary experiment at a representative reference temperature of 20° C.

FIG. 4 illustrates a curve representing an SOC-$V_{OC,ref}$ relationship obtained by a preliminary experiment at a representative reference temperature of 20° C.

The reference open-circuit voltage determination unit 142 may determine the reference open-circuit voltage value $V_{OC,ref}(k)$ corresponding to the SOC estimation value SOC(k) by using the SOC-$V_{OC,ref}$ relationship stored in the memory 150.

The reference open-circuit voltage determination unit 142 may continuously provide the reference open-circuit voltage value $V_{OC,ref}(k)$ for the parameter estimation unit 143 to estimate the first to third parameter values $\alpha_1(k)$, $\alpha_2(k)$, and $\alpha_3(k)$ of the battery parametric model. The reference open-circuit voltage value $V_{OC,ref}(k)$ may be determined to correspond to the SOC estimation value SOC(k), based on the SOC-$V_{OC,ref}$ relationship obtained through a preliminary experiment at a representative reference temperature, for example, such as at a room temperature of 20° C.

The SOC estimation value SOC(k) may be equal to the next SOC estimation value SOC(k+1) generated by the SOC estimation unit 144 before the sampling time period Δt.

Because there is no next SOC estimation value SOC(k+1) in the initial stage of executing the method of estimating an SOC of a battery according to embodiments of the present disclosure, the reference open-circuit voltage determination unit 142 may determine the present voltage value $V_t(k)$ as being equal to the reference open-circuit voltage value $V_{OC,ref}(k)$. Thereafter, when the SOC estimation unit 144 determines the next SOC estimation value SOC(k+1) of the battery 110 after a preset time period, for example, such as after the sampling time period Δt, then after the sampling time period Δt again, the next SOC estimation value SOC(k+1) becomes the SOC estimation value SOC(k), and the reference open-circuit voltage value $V_{OC,ref}(k)$ corresponding to the SOC estimation value SOC(k) may be determined by using the SOC-$V_{OC,ref}$ relationship and provided to the parameter estimation unit 143. The reference open-circuit voltage value $V_{OC,ref}(k)$ is used to determine the next SOC estimation value SOC(k+1). This process may be repeated while the method of estimating an SOC of a battery is executed.

The first to third parameter values $\alpha_1(k)$, $\alpha_2(k)$, and $\alpha_3(k)$ may be estimated by using RLS (e.g., at block S130), based on the present voltage value $V_t(k)$, the reference open-circuit voltage value $V_{OC,ref}(k)$, the present current value $I_L(k)$, and the previous current value $I_L(k-1)$.

The parameter estimation unit 143 may be provided with a current $I_L$ input to the battery 110 and a battery terminal voltage $V_t$ measured in the battery 110, and may use RLS to estimate the first to third parameters $\alpha_1$, $\alpha_2$, and $\alpha_3$ of the battery parametric model in real time or near real time. For example, the parameter estimation unit 143 may receive the present voltage value $V_t(k)$, the present current value $I_L(k)$, and the previous current value $I_L(k-1)$ from the receiver 141, receive the reference open-circuit voltage value $V_{OC,ref}(k)$ from the reference open-circuit voltage determination unit 142, and may estimate the first to third parameter values $\alpha_1(k)$, $\alpha_2(k)$, and $\alpha_3(k)$ by using RLS based on the present voltage value $V_t(k)$, the reference open-circuit voltage value $V_{OC,ref}(k)$, the present current value $I_L(k)$, and the previous current value $I_L(k-1)$.

The parameter estimation unit 143 uses a battery parametric model according to one or more embodiments of the present disclosure. Unlike an electrical internal resistance (Rint) model or a Thevenin model that may be used according to a comparative example, the battery parametric model may be designed to be robust against ambient temperature while using limited battery information.

As shown in Equation 1 below, the battery parametric model consists of a reference open-circuit voltage term $V_{OC,ref}(k)$, and two terms $I_L(k)$ and $I_L(k-1)$ related to an input current. Equation 1:

$$V_t(k)=\alpha_1(k)V_{OC,ref}(k)+\alpha_2(k)I_L(k)+\alpha_3(k)I_L(k-1)$$

In Equation 1, $\alpha_1(k)$, which is the coefficient of the open-circuit voltage term, compensates for the variation of an open-circuit voltage $V_{oc}$ of the battery 110, which changes due to the ambient temperature and aging of the battery, based on a reference open-circuit voltage $V_{oc,ref}$, and thus, enables battery modeling that is robust to various ambient temperature changes. In Equation 1, $\alpha_2(k)$ and $\alpha_3(k)$, which are the coefficients of the current terms, may be described as parameters denoting battery internal resistance denoting a battery voltage drop by the currently input current $I_L(k)$, and a polarization voltage at which the battery voltage fluctuates due to the difference between the previously input current $I_L(k-1)$ and the currently input current $I_L(k)$, respectively.

The parameter estimation unit 143 may apply RLS by using the current and the voltage of the battery 110 measured in real time or near real time, and the reference open-circuit voltage $V_{oc,ref}$ provided by the reference open-circuit voltage determination unit 142. As such, the parameter estimation unit 143 may estimate the first to third parameter values $\alpha_1(k)$, $\alpha_2(k)$, and $\alpha_3(k)$ of the battery parametric model.

The battery parametric model according to one or more embodiments of the present disclosure is applied with two assumptions to apply RLS to a battery Thevenin model according to a comparative example. In addition, one or more embodiments of the present disclosure complements an RLS algorithm in order to accurately estimate the parameters of the battery parametric model. By using the battery parametric model, it may be possible to improve the accuracy of the estimation of the battery voltage and the estimation of an SOC robustly to temperature changes, even without conducting a plurality of preliminary temperature experiments to identify changes in battery characteristics according to various different ambient temperatures.

Figure 5:
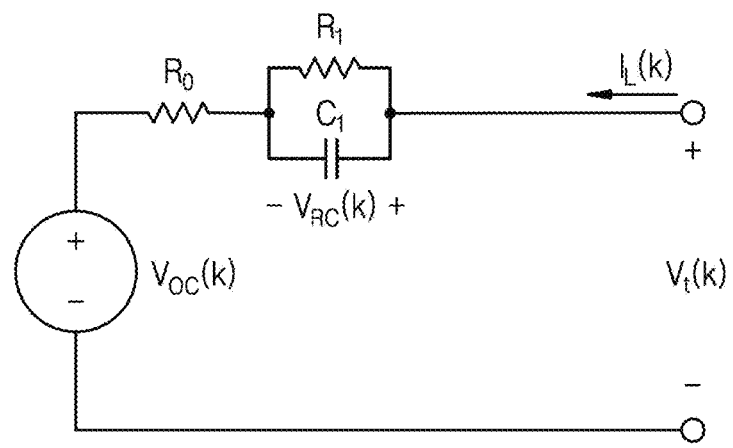
FIG. 5 illustrates a Thevenin equivalent circuit model of a battery.

The parameter estimation unit 143 uses a battery parametric model that is robust to temperature changes. Equation 1 of the battery parametric model is derived from a battery Thevenin model equation as illustrated in Equation 2 below. FIG. 5 illustrates a Thevenin equivalent circuit model of a battery. Equation 2 is a battery Thevenin model equation according to a comparative example. Equation 2:

$$V_t(k)=V_{OC}(k)+R_0I_L(k)+V_{RC}(k)$$

$$V'_{RC}(k)=I_L(k)/C_1-V_{RC}(k)/C_1R_1$$

In Equation 2, $V_{OC}(k)$ denotes an open-circuit voltage value of the battery 110, $I_L(k)$ denotes a present current value, $V_t(k)$ denotes a present voltage value, and $V_{RC}(k)$ denotes a present resistor-capacitor (RC) voltage value, and these values are represented in the battery Thevenin model of FIG. 5. Further, in Equation 2, $R_0$ denotes a series internal resistor, and $R_1$ and $C_1$ denote a parallel internal resistor and a capacitor, respectively.

Equation 3 is an equation obtained by Laplace transform of Equation 2.

$$V_t(s) = V_{OC}(s) + R_0I_L(s) + V_{RC}(s) = \qquad \text{Equation 3}$$

$$V_{OC}(s) + R_0I_L(s) + R_1I_L(s)/(1 + R_1C_1s)$$

By substituting $T^{-1}$ $(1-Z^{-1})$ for s in Equation 3 and rearranging it in order to apply a backward difference method to Equation 3, Equation 4 is obtained. Equation 4:

$$\{V_t(s)-V_{OC}(s)\}I_L(s)=R_0+TR_1/(T+R_1C_1(1-Z^{-1}))=$$
$$[(TR_0+TR_1+R_0R_1C_1)/(T+R_1C_1)-R_0R_1C_1Z^{-1}/(T+R_1C_1)]/[1+R_1C_1Z^{-1}/(T+R_1C_1)]$$

Equation 4 is transformed to Equation 5. Equation 5:

$$\{V_t(k)-V_{OC}(k)\}/I_L(k)=(a_2+a_3Z^{-1})/(1-a_1Z^{-1})$$

$$(1-a_1Z^{-1})\{V_t(k)-V_{OC}(k)\}=(a_2+a_3Z^{-1})I_L(k)$$

In Equation 5, $a_1$ is $-R_1C_1/(T+R_1C_1)$, $a_2$ is $(TR_0+TR_1+R_0R_1C_1)/(T+R_1C_1)$, and $a_3$ is $-R_0R_1C_1/(T+R_1C_1)$.

Again, Equation 5 is transformed to Equation 6. Equation 6:

$$V_t(k)-V_{OC}(k)-a_1\{V_t(k-1)-V_{OC}(k-1)\}=a_2I_L(k)+a_3I_L(k-1)$$

$$V_t(k)-a_1V_t(k-1)=V_{OC}(k)-a_1V_{OC}(k-1)+a_2I_L(k)+a_3I_L(k-1)$$

In a comparative example, Equation 3 is transformed to Equation 6 to estimate the open-circuit voltage $V_{OC}$ and the parameters $a_1$, $a_2$, and $a_3$, and the estimated parameters $a_1$, $a_2$, and $a_3$ are transformed to Thevenin model parameters $R_0$, $R_1$, and $C_1$ of Equation 3. Because the open-circuit voltage $V_{OC}$ and the Thevenin model parameters $R_0$, $R_1$, and $C_1$ estimated in the comparative example may vary greatly under the influence of the ambient temperature, it may be necessary to obtain a lookup table showing the change trend of each of the open circuit voltage $V_{OC}$ and the Thevenin model parameters $R_0$, $R_1$, and $C_1$ according to temperature change through preliminary experiments at numerous different temperature points within a desired ambient temperature range. In addition, the battery Thevenin model may have a fundamental disadvantage in that a voltage estimation error may occur as the temperature increases or decreases with respect to room temperature. In addition, for a temperature for which no preliminary experiments have been performed, approximate model parameters may need to be obtained by interpolation or extrapolation using the lookup table, and in this process, model parameter errors and voltage estimation errors may occur.

According to one or more embodiments of the present disclosure, an equation such as that shown in Equation 8 may be derived by applying two assumptions as shown in Equation 7 below to Equation 6 above. Equation 7:

$$V_{OC}(k) \approx V_{OC}(k-1)$$

$$V_t(k) \approx V_t(k-1)$$

$$V_t(k) = V_{OC}(k) + \{a_2/(1-a_1)\}I_L(k) + \{a_3/(1-a_1)\}I_L(k-1) \quad \text{Equation 8}$$

As shown above, the first assumption of Equation 7 is commonly used in the comparative example. The second assumption of Equation 7 is established when the instantaneous change in the current IL input to the battery 110 is not large. When the second assumption is not satisfied, or in other words, when the difference in one step of the measured voltage is greater than or equal to a particular value, by lowering the size of a forgetting factor λ of the RLS, it may be possible to reflect a modeling error that occurs when the second assumption is not satisfied, and to estimate accurate model parameters. For example, when the difference between the present voltage value $V_t(k)$ and the previous voltage value $V_t(k-1)$ is greater than a certain value, the value of the forgetting factor λ(k) may be reduced.

By changing the first term $V_{OC}(k)$ corresponding to the open-circuit voltage in Equation 8 to a term including the reference open-circuit voltage value $V_{OC,ref}(k)$, and simplifying the coefficients expressed as the parameters $a_1$, $a_2$, and $a_3$, a model equation of the battery parametric model of the disclosure is derived as illustrated Equation 9. Equation 9:

$$V_t(k) = \alpha_1(k)V_{OC,ref}(k) + \alpha_2(k)I_L(k) + \alpha_3(k)I_L(k-1)$$

In Equation 9, $\alpha_2(k)$ is $a_2/(1-a_1)$, and $\alpha_3(k)$ is $a_3/(1-a_1)$. In Equation 9, $\alpha_1(k)$ denotes a value for compensating for factors such as ambient temperature and aging that may affect the open-circuit voltage of the battery.

By substituting the reference open-circuit voltage value $V_{OC,ref}(k)$ for the first term in Equation 9 of the battery parametric model, SOC-$V_{OC}$ curves obtained at numerous temperature points used in the comparative example are not required. In other words, when factors such as ambient temperature and aging that may affect the open-circuit voltage of the battery 110 exist, the variation occurring in the open-circuit voltage may be compensated for through $\alpha_1(k)$ with respect to the reference open-circuit voltage. Accordingly, SOC-$V_{OC}$ curves obtained at different ambient temperatures may not be required.

The first to third parameter values $\alpha_1(k)$, $\alpha_2(k)$, and $\alpha_3(k)$ of the battery parametric model are estimated in real time or near real time by the parameter estimation unit 143 through RLS. By using, as a voltage model equation, Equation 9 that uses the first to third parameter values $\alpha_1(k)$, $\alpha_2(k)$, and $\alpha_3(k)$ without the need to transform them to Thevenin model parameters as in the comparative example, voltage estimation errors may be greatly reduced.

The battery parametric model is expressed as Equation 10 below with a regressor matrix ϕ(k) and a parameter matrix θ(k). Equation 10:

$$V_t(k) = \theta^T\phi = \theta^T(k)\phi(k)$$

In Equation 10, $V_t(k)$ denotes a present voltage value.

The regressor matrix ϕ(k) consists of the reference open-circuit voltage value $V_{OC,ref}(k)$, the present current value $I_L(k)$, and the previous current value $I_L(k-1)$, and is defined as illustrated in Equation 11. Equation 11:

$$\phi(k) = [V_{OC,ref}(k), I_L(k), I_L(k-1)]^T$$

When the parameter matrix θ(k) consists of the first to third parameter values $\alpha_1(k)$, $\alpha_2(k)$, and $\alpha_3(k)$, the parameter matrix θ(k) is defined as illustrated in Equation 12. Equation 12:

$$\theta(k) = [\alpha_1(k), \alpha_2(k), \alpha_3(k)]^T$$

The parameter estimation unit 143 may estimate the parameter matrix θ(k) to minimize or reduce the square of an error e(k) between the present voltage value $V_t(k)$ and the present voltage estimation value $V^\wedge_t(k)$, according to RLS. For example, the parameter matrix θ(k) may be determined by Equation 13. Equation 13:

$$\theta(k) = \theta(k-1) + K(k)e(k)$$

In Equation 13, K(k) denotes a gain matrix, the error e(k) is defined as $e(k) = V_t(k) - V^\wedge_t(k)$, and the present voltage estimation value $V^\wedge_t(k)$ is determined as illustrated in Equation 14 below, by using the regressor matrix ϕ(k) and the previous value θ(k−1) of the parameter matrix. Equation 14:

$$V^\wedge_t(k) = \theta^T(k-1)\phi(k)$$

The gain matrix K(k) is determined by Equation 15. Equation 15:

$$K(k) = P(k)\phi(k) = P(k-1)\phi(k)/[\lambda(k) + \phi^T(k)P(k-1)\phi(k)]$$

In Equation 15, P(k) denotes a covariance matrix, and λ(k) denotes a forgetting factor. The value of the forgetting factor λ(k) is an integer value between 0 and 1, and as the value of the forgetting factor λ(k) approaches 1, the present voltage value $V_t(k)$ and the present current value $I_L(k)$ affects the first to third parameter values $\alpha_1(k)$, $\alpha_2(k)$, and $\alpha_3(k)$ for a long time, and as the value of the forgetting factor λ(k) approaches 0, the present voltage value $V_t(k)$ and the present current value $I_L(k)$ affects the first to third parameter values $\alpha_1(k)$, $\alpha_2(k)$, and $\alpha_3(k)$ only for a short time. The value of the forgetting factor λ(k) may be set to decrease when the difference between the present voltage value $V_t(k)$ and the previous voltage value $V_t(k-1)$ is greater than a preset value.

The covariance matrix P(k) is determined by Equation 16. Equation 16:

$$P(k) = (P(k-1) - K(k)\phi^T(k)P(k-1))/\lambda(k)$$

The parameter estimation unit 143 may estimate the first to third parameter values $\alpha_1(k)$, $\alpha_2(k)$, and $\alpha_3(k)$ of the battery parametric model in real time or near real time by calculating the present voltage estimation value $\hat{V}_t(k)$ through the previous value $\theta(k-1)$ of the estimated parameter matrix and the measured regressor matrix $\phi(k)$, calculating the error $e(k)$ between the present voltage value $V_t(k)$ and the present voltage estimation value $\hat{V}_t(k)$, and then varying the degree of updating the present value $\theta(k)$ of the parameter matrix according to the degree of the error $e(k)$.

The next SOC estimation value SOC(k+1) of the battery 110 may be determined by using an EKF, based on the SOC estimation value SOC(k), the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$ (e.g., block S140).

The SOC estimation unit 144 may estimate a battery voltage $\hat{V}_t$ in real time or near real time by using the first to third parameters $\alpha_1$, $\alpha_2$, and $\alpha_3$ estimated by the parameter estimation unit 143, and may use an EKF algorithm to estimate an SOC of the battery 110 based on an error between the measured battery voltage $V_t$ and the estimated battery voltage $\hat{V}_t$. For example, the SOC estimation unit 144 may receive the present voltage value $V_t(k)$, the present current value $I_L(k)$, and the previous current value $I_L(k-1)$ from the receiver 141, receive the reference open-circuit voltage value $V_{OC,ref}(k)$ from the reference open-circuit voltage determination unit 142, and receive the first to third parameter values $\alpha_1(k)$, $\alpha_2(k)$, and $\alpha_3(k)$ from the parameter estimation unit 143. The SOC estimation unit 144 may determine the next SOC estimation value SOC(k+1) of the battery 110 by using an EKF, based on the SOC estimation value SOC(k), the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$. The SOC estimation unit 144 may use the SOC-$V_{OC,ref}$ relationship stored in the memory 150 to operate the EKF.

The EKF includes a state equation as shown in Equation 17 below, and a battery model equation as shown in Equation 18 below. Equation 17:

$$SOC(k+1)=SOC(k)+(\eta T/C_n)*I_L(k)+w(k)$$

In Equation 17, $\eta$ denotes the charge and discharge efficiency, T denotes a sampling period, $C_n$ denotes the capacity of the battery, and $w(k)$ denotes process noise.

$$V_t(k)=\alpha_1(k)h(SOC(k))+\alpha_2(k)I_L(k)+\alpha_3(k)I_L(k-1)+v(k) \quad \text{Equation 18:}$$

In Equation 18, $v(k)$ denotes observation noise, and $h(SOC(k))$ denotes the reference open-circuit voltage value $V_{OC,ref}(k)$ corresponding to the SOC estimation value SOC(k).

The first to third parameter values $\alpha_1(k)$, $\alpha_2(k)$, and $\alpha_3(k)$ of the battery parametric model estimated by the parameter estimation unit 143 are used by the SOC estimation unit 144 to estimate the SOC of the battery 110 by using an EKF algorithm. Equations for implementing the EKF algorithm are illustrated as follows.

$$SOC(k)=x_k, I_L(k)=u_k, V_t(k)=y_k$$

$$X_{k+1}=f(x_k,u_k)+w_k=x_k+(\eta T/C_n)u_k+w_k$$

$$y_k=g(x_k,u_k,u_{k-1})+v_k=\alpha_1 h(x_k)+\alpha_2 u_k+\alpha_3 u_{k-1}+v_k$$

$$A_k=1, B_k=\eta T/C_n, C_k=\alpha_{1,k}dh/dx|_{x=xk}$$

$$P^-_k=A_{k-1}P^+_{k-1}A^T_{k-1}+Q$$

$$L_k=P^-_k(C_k)^T[C_k P^-_k C^T_k+R]^{-1}$$

$$\hat{x}^+_k=\hat{x}^-_k+L_k[y_k-g(\hat{x}^-_k,u_k,u_{k-1})]$$

$$P^+_k=(I-L_k C_k)P^-_k$$

The SOC value SOC(k) of the battery to be estimated in real time or near real time by the SOC estimation unit 144 is defined as a state $x_k$, and the voltage value $V_t(k)$ and the current value $I_L(k)$ measured by the voltage measurement unit 120 and the current measurement unit 130 are defined as variables $y_k$ and $u_k$ suitable for the EKF algorithm, respectively. In addition, a state equation (e.g., Equation 17) for the state $x_k$ and a battery model equation (e.g., Equation 18) for the battery voltage model are defined.

The SOC estimation unit 144 estimates an SOC suitable for the current state of the battery 110 by identifying the difference between a battery voltage estimation value $\hat{x}^-_k$ estimated by using the first to third parameter values $\alpha_1(k)$, $\alpha_2(k)$, and $\alpha_3(k)$ of the battery parametric model estimated by the parameter estimation unit 143, and a currently measured battery voltage value $y_k$, selecting the state $x_k$ that minimizes or reduces the difference, and updating the state $x_k$ by a coulomb counting method.

Here, $x_k$ is defined as a state matrix, $y_k$ is defined as a measurement matrix, $u_k$ is defined as a control vector, $w_k$ is defined as process noise, $v_k$ is defined as observation noise, and Q and R are defined as the covariances of $w_k$ and $v_k$, respectively. Q and R are user parameters, and may be determined according to experimental data and environment. In general, the ratio of Q to R may be important, and the degree of reflection of the state determined by a state equation for $x_{k+1}$ and a battery model equation for $y_k$ may be determined according to the ratio of Q to R.

The function h represents a reference SOC-$V_{OC,ref}$ curve at a representative reference temperature. In other words, $h(x_k)$ outputs the reference open-circuit voltage value $V_{OC,ref}(k)$ for the state $x_k$.

In the above equations, + and − expressed in the exponents mean estimation times. For example, $\hat{x}^-_k$ denotes $\hat{x}_k$ estimated at the (k−1)-th sampling time and $\hat{x}^+_k$ denotes $\hat{x}_k$ estimated at the k-th sampling time.

The next SOC estimation value SOC(k+1) of the battery 110 estimated in real time or near real time by the SOC estimation unit 144 is used by the reference open-circuit voltage determination unit 142 to determine the reference open-circuit voltage value $V_{OC,ref}(k)$ at the next sampling time. The reference open-circuit voltage value $V_{OC,ref}(k)$ initially determined to be equal to the present voltage value $V_t(k)$ is updated to be the reference open-circuit voltage value $V_{OC,ref}(k)$ determined by the next SOC estimation value SOC(k+1). This process is repeated until the process of estimating the SOC of the battery 110 in real time or near real time is terminated.

Hereinafter, results of verifying that the method of estimating an SOC of a battery according to one or more embodiments of the present disclosure has higher accuracy than that of the comparative example will be described in more detail.

Figure 6:
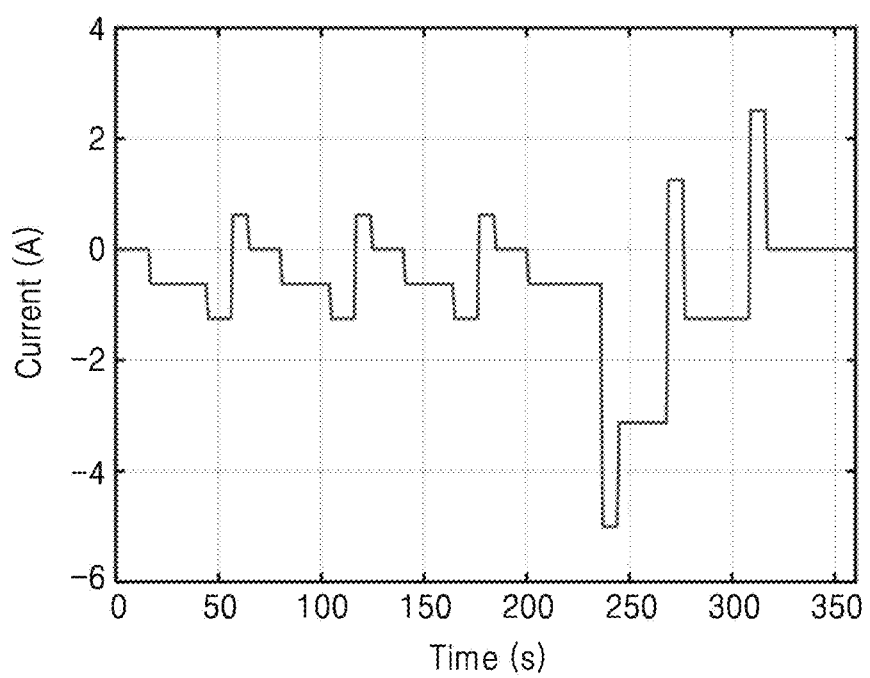
FIG. 6 shows a current waveform input to a battery in order to verify the accuracy of a method of estimating a state of charge of a battery according to an embodiment of the present disclosure.

FIG. 6 shows a current waveform input to a battery in order to verify the accuracy of the method of estimating an SOC of a battery according to an embodiment of the present disclosure.

In experimental verification, the current waveform shown in FIG. 6 is applied to a lithium-ion battery at −6° C., and the voltage of the battery is measured. The current waveform shown in FIG. 6 is periodically applied to the battery. The current variation frequency of the current waveform may be higher than a preset rate, such that first to third parameters may be sufficiently accurately estimated by the parameter estimation unit 143, and the measurement sampling rate may be sufficiently high compared to the current variation. In addition, the current waveform may satisfy a persistent excitation condition, and the current waveform shown in FIG. 6 satisfies the persistent excitation condition.

Figure 7:
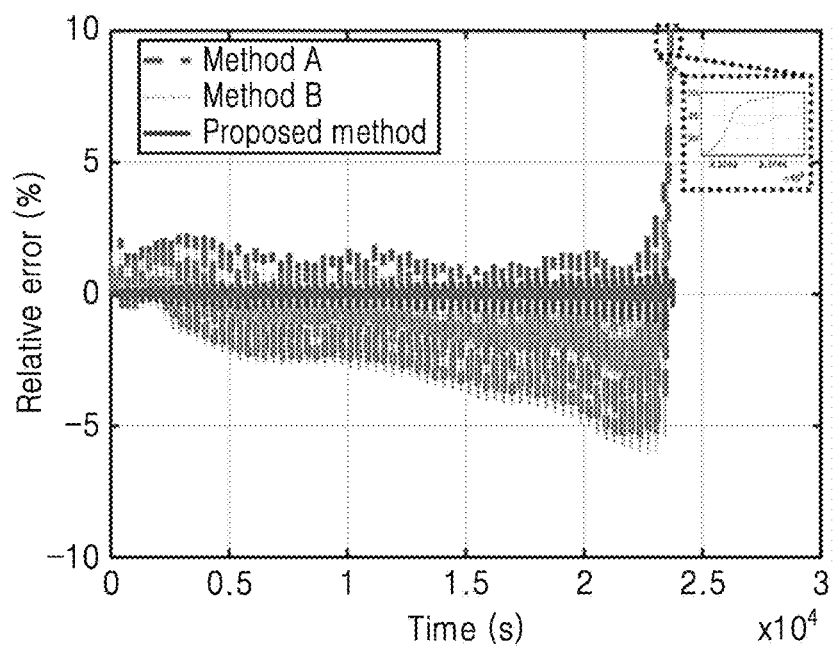
FIG. 7 shows relative errors between battery voltages estimated according to a comparative example and actually measured voltages, and relative errors between battery voltages estimated according to one or more embodiments of the present disclosure and actually measured voltages.

FIG. 7 shows relative errors between battery voltages estimated according to a comparative example and actually measured voltages (e.g., Method A and Method B), and relative errors between battery voltages estimated according to one or more embodiments of the present disclosure and actually measured voltages (e.g., Proposed method), for which the current value of the current waveform of FIG. 6 applied to the battery and the voltage value of the battery measured accordingly were used.

For the comparative example, an SOC-$V_{OC}$ curve obtained by conducting a preliminary experiment at a corresponding experimental temperature was commonly used. Method A of the comparative example reflects battery characteristics in a lookup table at a preliminary experimental temperature, and Method B of the comparative example reflects battery characteristics at a preliminary experimental temperature in real-time estimation.

As shown in FIG. 7, the use of the methods of the comparative example in an extreme sub-zero temperature situation that greatly changes the characteristics of a battery results in battery voltage estimation errors fluctuating greatly up and down, and thus, large errors, whereas the use of the method according to one or more embodiments of the present disclosure enables significantly improved and stable battery voltage estimation compared to the results of the comparative example.

The method using the battery parametric model according to one or more embodiments of the present disclosure has higher accuracy in estimating the SOC of a battery than the methods of the comparative example using the battery Thevenin model. As an example of experimental verification related to this, relative errors between SOCs of a battery estimated by using the comparative example (e.g., Method A and Method B) and the method according to one or more embodiments of the present disclosure (e.g., Proposed method), by measuring the battery voltage while continuously discharging the battery at −8° C. with the current waveform shown in FIG. 6, and actual SOCs are shown in FIG. 8.

Figure 8:
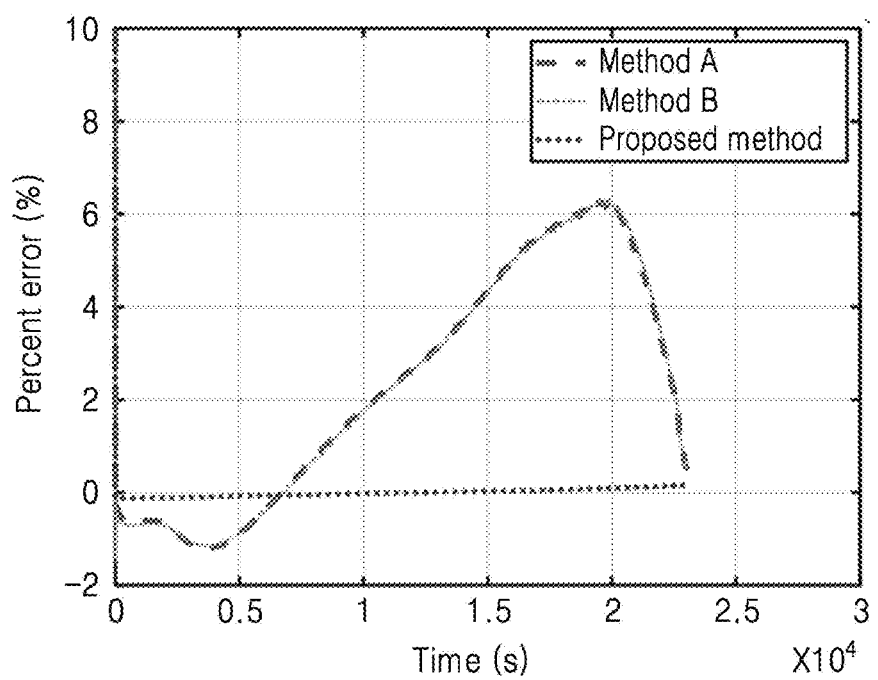
FIG. 8 shows relative errors between states of charge of a battery estimated by using a comparative example and a method according to one or more embodiments of the present disclosure, by measuring the battery voltage while continuously discharging the battery at −8° C. with the current waveform shown in FIG. 6, and actual states of charge.

Although the EKF algorithm was used to estimate the SOC in the methods of the comparative example and of the present disclosure, referring to FIG. 8, it may be seen that the SOC estimation accuracy varies due to the difference in battery voltage modeling. While the SOC estimation error occurred up to about 6% when using the methods of the comparative example, the maximum error was only about 0.2% when using the method according to one or more embodiments of the present disclosure. Therefore, it may be seen that the method according to one or more embodiments of the present disclosure has a great effect in estimating an SOC.

Although the above experimental verification was conducted at one fixed temperature, it was additionally confirmed that the method according to one or more embodiments of the present disclosure enables accurate battery voltage estimation and high SOC estimation accuracy, even in a variable temperature situation in which the temperature changes in real time.

Figure 9:
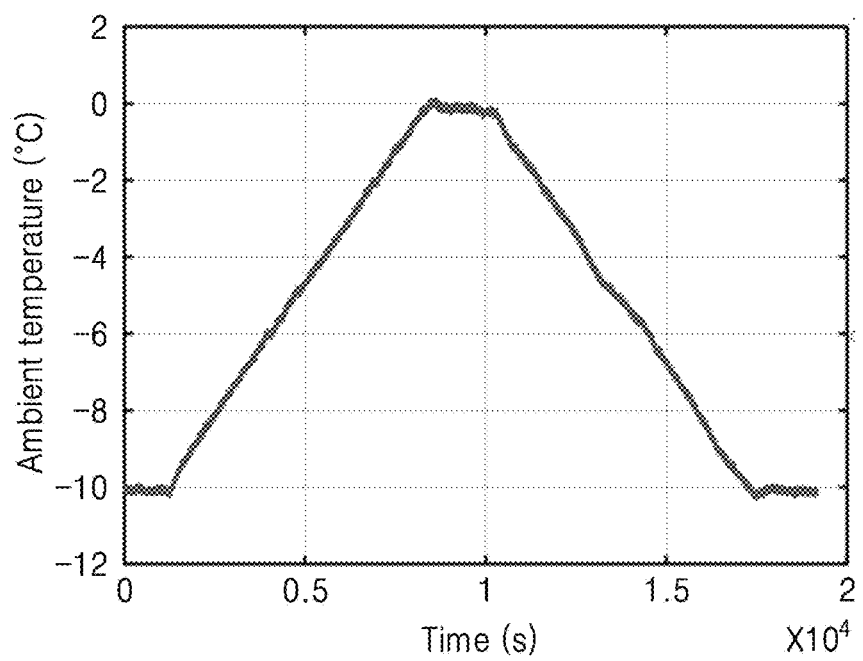
FIG. 9 shows a real-time variable ambient temperature situation that is expected to occur in a battery operation during the winter.
Figure 10:
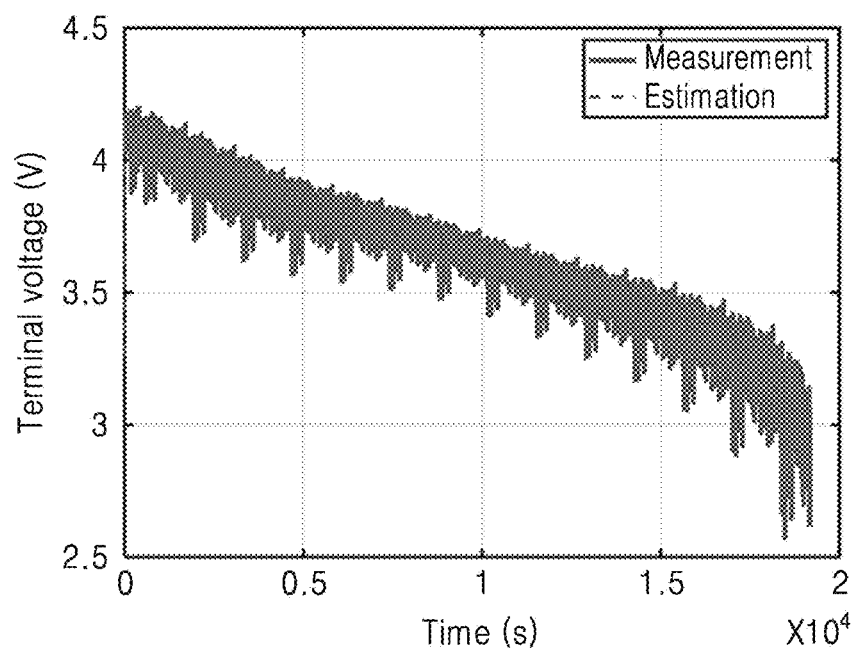
FIG. 10 shows the voltage measured when a battery is discharged in the variable temperature situation shown in FIG. 9, and the battery voltage estimated by using a method according to one or more embodiments of the present disclosure.

FIG. 9 shows a real-time variable ambient temperature situation that is expected to occur in battery operation during the winter. FIG. 10 shows the voltage measured (e.g., Measurement) when a battery is discharged in the variable temperature situation shown in FIG. 9, and the battery voltage estimated (e.g., Estimation) by using the method according to one or more embodiments of the present disclosure. In other words, the measured voltage value and the estimated voltage value were significantly similar to each other not only in a fixed temperature situation, but also in the real-time variable temperature situation. Therefore, it may be seen that the effect of battery voltage estimation according to one or more embodiments of the present disclosure is excellent.

As described above, battery voltage modeling and SOC estimation methods considering the temperature in the comparative example may have a limitation in that it may be necessary to conduct various experiments to identify changes in battery characteristics at a plurality of different temperature points including a battery operating temperature range, and even when the corresponding experimental data is used, a large voltage modeling error may occur due to the inaccuracy of an existing electrical model. On the other hand, according to one or more embodiments of the present disclosure, the use of the estimation method may remove the burden of preliminary temperature experiments, and it may be seen that the battery voltage estimation accuracy and SOC estimation accuracy are greatly improved.

According to one or more embodiments of the present disclosure, it may be possible to reduce the time and effort for a preliminary experiment by overcoming the limitation that the preliminary temperature experiment needs to be performed several times in order to analyze changes in battery characteristics according to the ambient temperature. In addition, in terms of accuracy, the voltage modeling accuracy and SOC estimation accuracy are greatly improved compared to electrical modeling methods commonly used in the comparative example. Accordingly, an accurate SOC may be obtained by a BMS regardless of the region in which the battery is used and temperature changes due to the season. In addition, it may be possible to accurately predict the remaining usage time of electric vehicles, portable electronic devices, and the like that uses batteries, and it may be of great help in improving battery management techniques such as capacity estimation and/or short circuit fault diagnosis.

The foregoing is illustrative of some embodiments of the present disclosure, and is not to be construed as limiting thereof. Although some embodiments have been described, those skilled in the art will readily appreciate that various modifications are possible in the embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific embodiments disclosed herein, and that various modifications to the disclosed embodiments, as well as other example embodiments, are intended to be included within the spirit and scope of the present disclosure as defined in the appended claims, and their equivalents.

What is claimed is:

1. A method of estimating a state of charge of a battery, the method comprising:
   generating a present voltage value $V_t(k)$ and a present current value $I_L(k)$ by detecting a voltage and a current of the battery;
   determining a reference open-circuit voltage value $V_{OC,ref}(k)$ based on a state-of-charge estimation value $SOC(k)$;
   estimating first to third parameter values $\alpha_1(k)$, $\alpha_2(k)$, and $\alpha_3(k)$ from the present voltage value $V_t(k)$, the reference open-circuit voltage value $V_{OC,ref}(k)$, the present current value $I_L(k)$, and a previous current value $I_L(k-1)$ by using recursive least squares (RLS); and
   determining, using an extended Kalman filter (EKF), a next state-of-charge estimation value $SOC(k+1)$ of the battery from the state-of-charge estimation value $SOC(k)$, the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$.

2. The method of claim 1, wherein the first to third parameter values $\alpha_1(k)$, $\alpha_2(k)$, and $\alpha_3(k)$ are estimated to minimize a square of an error $e(k)$ between the present voltage value $V_t(k)$ and a present voltage estimation value $\hat{V}_t(k)$.

3. The method of claim 2, wherein a parameter matrix $\theta(k)$ including the first to third parameter values $\alpha_1(k)$, $\alpha_2(k)$, and $\alpha_3(k)$ is determined by $\theta(k)=\theta(k-1)+K(k)e(k)$, where $K(k)$ is a gain matrix, and
   wherein the error $e(k)$ is determined according to $e(k)=V_t(k)-\hat{V}_t(k)$.

4. The method of claim 3, wherein the present voltage estimation value $\hat{V}_t(k)$ is determined by using a regressor matrix $\phi(k)$ including the reference open-circuit voltage value $V_{OC,ref}(k)$, the present current value $I_L(k)$, the previous current value $I_L(k-1)$, and a previous value $\theta(k-1)$ of the parameter matrix, according to $\hat{V}_t(k)=\theta^T(k-1)\phi(k)$,
   where the regressor matrix $\phi(k)$ is defined according to $\phi(k)=[V_{OC,ref}(k), I_L(k), I_L(k-1)]^T$, and the parameter matrix $\theta(k)$ is defined according to $\theta(k)=[\alpha_1(k), \alpha_2(k), \alpha_3(k)]^T$.

5. The method of claim 4, wherein the gain matrix $K(k)$ is determined by $K(k)=P(k)\phi(k)=P(k-1)\phi(k)/[\lambda(k)+\phi^T(k)P(k-1)\phi(k)]$, where $P(k)$ is a covariance matrix, and $\lambda(k)$ is a forgetting factor.

6. The method of claim 5, wherein the covariance matrix $P(k)$ is determined by $P(k)=(P(k-1)-K(k)\phi^T(k)P(k-1))/\lambda(k)$.

7. The method of claim 5, wherein a value of the forgetting factor $\lambda(k)$ decreases when a difference between the present voltage value $V_t(k)$ and a previous voltage value $V_t(k-1)$ is greater than a preset value.

8. The method of claim 1, wherein the EKF comprises a state equation defined according to $SOC(k+1)=SOC(k)+(\eta T/C_n)*I_L(k)+w(k)$, and a battery model equation defined according to $V_t(k)=\alpha_1(k)h(SOC(k))+\alpha_2(k)I_L(k)+\alpha_3(k)I_L(k-1)+v(k)$, where $\eta$ is a charge and discharge efficiency, $T$ is a sampling period, $C_n$ is a capacity of the battery, $w(k)$ is process noise, $v(k)$ is observation noise, and $h(SOC(k))$ is the reference open-circuit voltage value $V_{OC,ref}(k)$.

9. A computer program stored in a non-transitory medium and executable by a computing device to perform the method of claim 1.

10. A device for estimating a state of charge of a battery, the device comprising:
    memory configured to store an $SOC$-$V_{OC,ref}$ relationship between a state-of-charge value and an open-circuit voltage value of the battery at a reference temperature;
    a receiver configured to receive a present voltage value $V_t(k)$ and a present current value $I_L(k)$, which are generated by detecting a voltage and a current of the battery;
    a reference open-circuit voltage determination circuit configured to determine a reference open-circuit voltage value $V_{OC,ref}(k)$ corresponding to a state-of-charge estimation value $SOC(k)$ by using the $SOC$-$V_{OC,ref}$ relationship stored in the memory;
    a parameter estimation circuit configured to estimate first to third parameter values $\alpha_1(k)$, $\alpha_2(k)$, and $\alpha_3(k)$ by using recursive least squares (RLS), from the present voltage value $V_t(k)$, the reference open-circuit voltage value $V_{OC,ref}(k)$, the present current value $I_L(k)$, and a previous current value $I_L(k-1)$; and
    a state-of-charge estimation circuit configured to determine a next state-of-charge estimation value $SOC(k+1)$ of the battery by using an extended Kalman filter (EKF), from the state-of-charge estimation value $SOC(k)$, the present voltage value $V_t(k)$, the reference open-circuit voltage value $V_{OC,ref}(k)$, the present current value $I_L(k)$, the previous current value $I_L(k-1)$, and the first to third parameter values $\alpha_1(k)$, $\alpha_2(k)$, and $\alpha_3(k)$.

* * * * *